(12) United States Patent
Zhang (10) Patent No.: US 9,405,141 B2
(45) Date of Patent: Aug. 2, 2016

(54) LIQUID CRYSTAL DISPLAY DEVICE (71) Applicant: SHENZHEN CHINA STAR OPTOELECTRONICS TECHNOLOGY CO., LTD., Shenzhen, Guangdong (CN)

(72) Inventor: Yanxue Zhang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 38 days.

(21) Appl. No.: 14/364,232

(22) PCT Filed: May 23, 2014

(86) PCT No.: PCT/CN2014/078292
§ 371 (c)(1),
(2) Date: Jun. 10, 2014

(87) PCT Pub. No.: WO2015/176308
PCT Pub. Date: Nov. 26, 2015

(65) Prior Publication Data
US 2015/0355494 A1    Dec. 10, 2015

(30) Foreign Application Priority Data
May 21, 2014    (CN) .......................... 2014 1 0216287

(51) Int. Cl.
A47B 5/00      (2006.01)
G02F 1/1333    (2006.01)
(Continued)

(52) U.S. Cl.
CPC ........ *G02F 1/133308* (2013.01); *H05K 5/0008* (2013.01); *H05K 5/0017* (2013.01); *H05K 5/0217* (2013.01); *H05K 5/03* (2013.01); *G02F 2001/13332* (2013.01); *G02F 2001/133314* (2013.01); *G02F 2001/133317* (2013.01); *G02F 2201/46* (2013.01)

(58) Field of Classification Search
CPC ................................ H04N 5/645; A47B 81/06
USPC ....... 312/7.2; 403/408.1; 40/781; 361/679.22
See application file for complete search history.

(56) References Cited

U.S. PATENT DOCUMENTS 6,256,075 B1 *  7/2001  Yang ...................... G06F 1/1601
                                                    312/7.2
7,812,891 B2 * 10/2010  Maruta .................... H04N 5/64
                                                    312/7.2

(Continued)

FOREIGN PATENT DOCUMENTS

| CN | 201894015 | | 7/2011 |
| WO | WO2007074847 | * | 7/2007 |
| WO | WO2013035664 | * | 3/2013 |

*Primary Examiner* — Matthew Ing
(74) *Attorney, Agent, or Firm* — Brooks Kushman P.C.

(57) ABSTRACT

A liquid crystal display device having a front frame, a back panel, a middle frame and a fixing unit is provided. A fixing post is installed on an inner surface of the frame side of the front frame, the position of the back panel corresponding with the fixing post includes a first through hole, and the position of the middle frame corresponding with the fixing post having a second through hole; wherein the fixing post includes a fixing hole, the fixing post passes through the second through hole and is installed in the first through hole, and the fixing unit is fixed and connected with the fixing hole so that the front frame, the middle frame and the back panel are fixed each other.

17 Claims, 6 Drawing Sheets (51) Int. Cl.
*H05K 5/00* (2006.01)
*H05K 5/02* (2006.01)
*H05K 5/03* (2006.01)

(56) References Cited

U.S. PATENT DOCUMENTS

| | | | |
|---|---|---|---|
| 8,366,213 B2 * | 2/2013 | Iwai | H04N 5/64 312/7.2 |
| 2005/0105259 A1 * | 5/2005 | Lee | G06F 1/1601 361/679.21 |
| 2006/0133017 A1 * | 6/2006 | Bang | G06F 1/1601 361/679.22 |
| 2006/0268193 A1 * | 11/2006 | Wang | G02F 1/133308 349/59 |
| 2009/0122222 A1 * | 5/2009 | Hamada | H04N 5/645 349/58 |
| 2013/0107127 A1 * | 5/2013 | Yokawa | G02F 1/133308 348/725 |
| 2014/0333867 A1 * | 11/2014 | Zhang | G02F 1/133308 349/58 |

* cited by examiner

LIQUID CRYSTAL DISPLAY DEVICE

CROSS-REFERENCE TO RELATED APPLICATION

This application is the U.S. national phase of PCT Application No. PCT/CN2014/078292 filed on May 23, 2014, which claims priority to Chinese Patent Application No. 201410216287.1 filed on May 21, 2014, the disclosures of which are incorporated in their entirety by reference herein.

FIELD OF THE INVENTION

The present invention belongs to a field of a liquid crystal display, more particularly, the invention related to a liquid crystal display device.

BACKGROUND OF THE INVENTION

Figure 1:
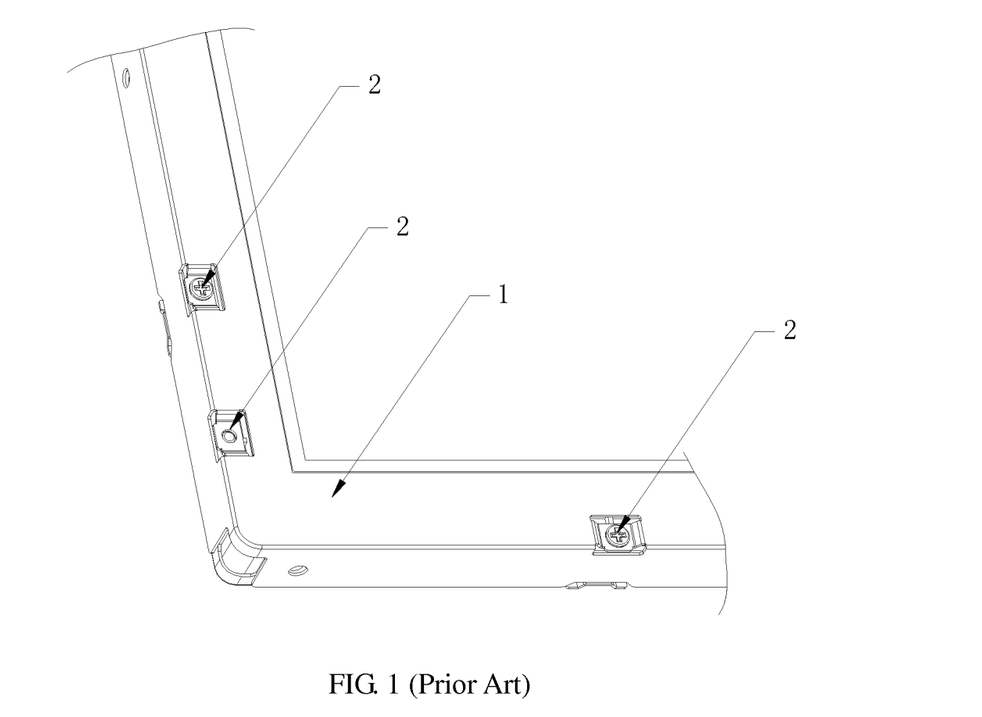
FIG. 1 is a structural schematic view of a front frame of a conventional liquid crystal display device.
Figure 2:
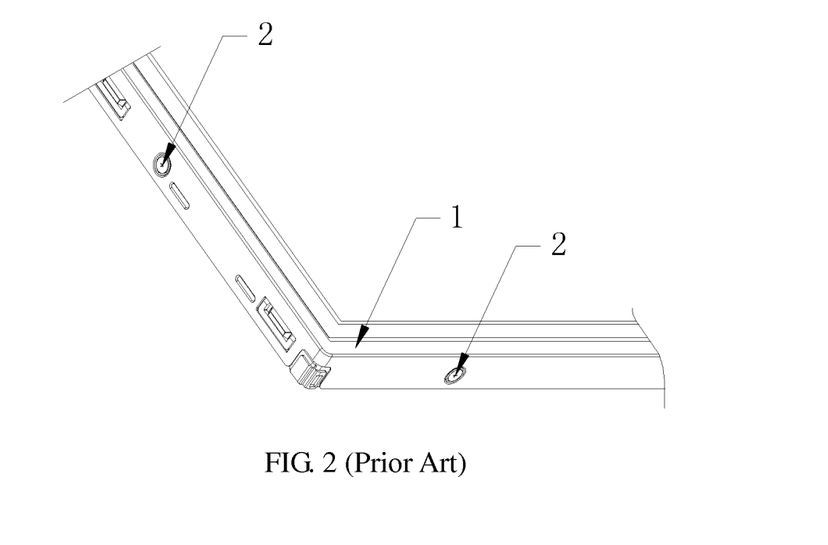
FIG. 2 is another structural schematic view of a front frame of a conventional liquid crystal display device.

A conventional liquid crystal display device comprises a liquid crystal display panel, a back light module, a front frame and a back panel. Since the front frame 1 needs to fix components like the liquid crystal display panel and so on, the front frame 1 is equipped with a fixing structure 2 like holes, bumps and so forth on the front (as shown in FIG. 1) or side wall (as shown in FIG. 2) thereof, and the appearance of the front frame 1 like this is not good, it cannot be used as an appearance parts of the liquid crystal display device. A front cover's generally adopted to cover the front frame 1, which plays a role of decorating and beautifying. However, if the front frame 1 meets the requirement for the appearance parts of the liquid crystal display device, that is, the outside surface of the front frame 1 is smooth without the fixing structure 2, it doesn't need to use the additional front cover to cover the front frame 1.

SUMMARY OF THE INVENTION

In order to resolve the above technical problem that the conventional technique has, the target of the invention is providing a liquid crystal display device comprising a front frame, a back panel and a fixing unit; wherein a fixing post is installed on an inner surface of the frame side of the front frame, the position of the back panel corresponding with the fixing post comprises a first through hole; wherein the fixing post comprises a fixing hole, the fixing post is installed in the first through hole, the fixing unit is fixed and connected with the fixing hole so that the front frame and the back panel are fixed each other.

Furthermore, the liquid crystal display device further comprises a middle frame installed between the front frame and the back panel; wherein the position of the middle frame corresponding with the fixing post comprises the second through hole, the fixing post passes through the second through hole and is installed in the first through hole, the fixing unit is fixed and connected with the fixing hole so that the front frame, the middle frame and the back panel are fixed each other.

Furthermore, a plurality of fixing posts are installed on an inner surface of the same frame side of the front frame; wherein the plurality of fixing posts may be arranged to be spaced.

Furthermore, only one fixing post is installed on an inner surface of the same frame side of the front frame, and the fixing post comprises a plurality of fixing holes; wherein the plurality of fixing holes are arranged to be spaced.

Furthermore, the fixing post is installed on all of the inner surfaces of four frame sides of the front frame.

Furthermore, the fixing post is installed only on the inner surfaces of the two opposite frame sides of the front frame.

Furthermore, the fixing post is fixed and installed on the inner surface of the frame side of the front frame by means of soldering or riveting.

Furthermore, the fixing post is molded integrally with the front frame.

Furthermore, the fixing unit is a screw, and a screw thread matched with the fixing unit is installed at an inner wall of the fixing hole.

The liquid crystal display device according to the invention, by installing the fixing post having the fixing hole on the inner surface of the frame side of the front frame, installing the first through hole at the position of the back panel corresponding with the fixing post, installing the fixing post in the first through hole, and fixing and connecting the fixing unit with the fixing hole, makes the front frame and the back panel fixed each other, and in this way, the outside surface of the front frame doesn't need to install fixing structure so that the outside surface is smooth and meets the requirement for the appearance parts of the liquid crystal display device.

BRIEF DESCRIPTION OF THE DRAWINGS

The above and other aspects, features and advantages of the embodiments of the invention will become more apparent from the following description, taken in conjunction with the accompanying drawings of which.

DETAILED DESCRIPTION OF THE EMBODIMENTS

Hereinafter, the embodiments of the present invention will be described in detail with reference to the accompanying drawings. This invention may, however, be embodied in different forms and should not be construed as limited to the embodiments set forth herein. Rather, these embodiments are provided so as to explain the principle of the invention and the actual application thereof, so that those skilled in the art will appreciate various embodiments of the invention and various modifications suitable for specific desired applications.

Figure 3:
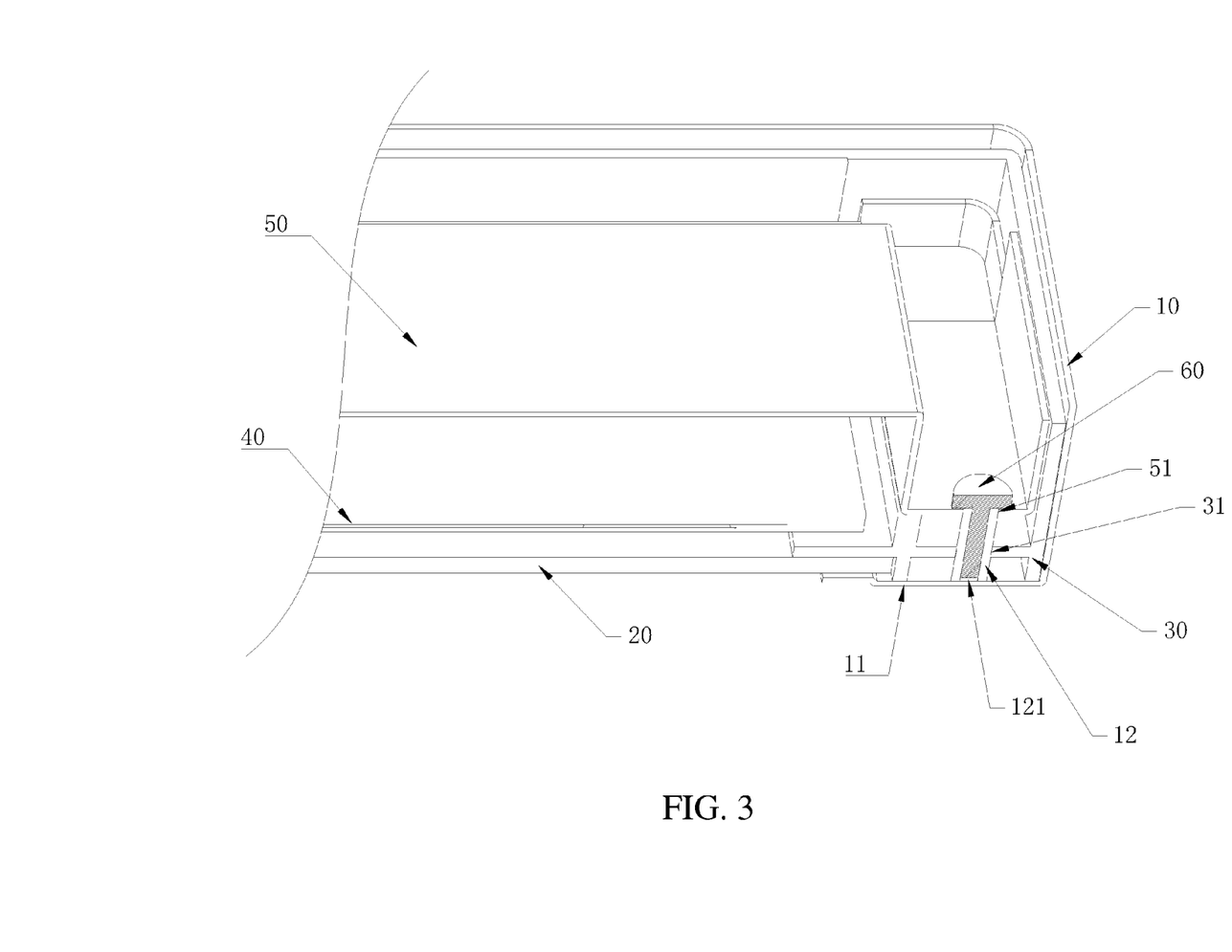
FIG. 3 is a partial sectional view of the liquid crystal display device according to an embodiment of the invention.
Figure 4:
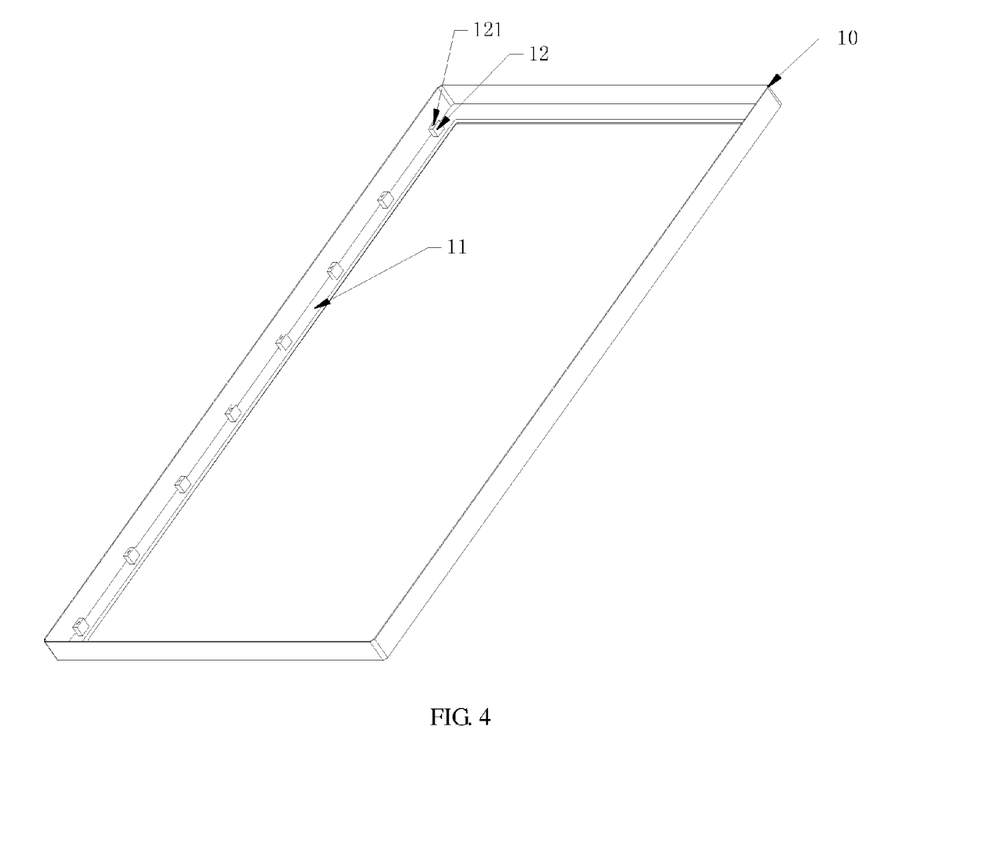
FIG. 4 is a rear perspective view of the front frame according to an embodiment of the invention.

FIG. 3 is a partial sectional view of the liquid crystal display device according to an embodiment of the invention. FIG. 4 is a rear perspective view of the front frame according to an embodiment of the invention.

Referring to FIG. 3 and FIG. 4, the liquid crystal display device according to an embodiment of the invention comprises a front frame 10, a liquid crystal display panel 20, a middle frame (or called a glue frame) 30, a back light module 40 and a back panel 50.

Specifically, the back light module 40 is installed on the back panel 50, the middle frame 30 is installed on the back light module 40, the liquid crystal display panel 20 is installed on the middle frame 30, and the front frame 10 is installed on the liquid crystal display panel 20. In this embodiment of the invention, a fixing post 12 is installed on the inner surface of the frame side 11 of the front frame 10, wherein the fixing post 12 has a fixing hole 121. The position of the back panel 50 corresponding with the fixing post 12 has the first through hole 51, and the position of the middle frame 30 corresponding with the fixing post 12 has the second through hole 31. The fixing post 12 passes through the second through hole 31, is installed in the first through hole 51 and fixed and connected with the fixing hole 121 by means of a fixing unit 60 to fix the front frame 10, the middle frame 30 and the back panel 50 each other, so that the back light module 40 is fixed between the middle frame 30 and the back panel 50, and the liquid crystal display panel 20 is fixed between the front frame 10 and the middle frame 30. Here, the fixing unit 60 may be, for example, a screw and a screw thread matched with the fixing unit 60 is installed at an inner wall of the fixing hole 121.

Furthermore, it should be understood that, as another embodiment of the invention, the middle frame 30 may be fixed and combined with the back panel 50 by other suitable fixing means, in turn, the back light module 40 is fixed between the middle frame 30 and the back panel 50. That is, the position of the middle frame 30 corresponding with the fixing post 12 doesn't need to have the second through hole 31. In other words, the fixing post 12 installed on the inner surface of the frame side 11 of the front frame 10 just needs to be installed in the first through hole 51, and fixed and connected with the fixing hole 121 by means of the fixing unit 60 to fix the front frame 10 and the back panel 50 each other, so that the liquid crystal display panel 20 is fixed between the front frame 10 and the middle frame 30.

Furthermore, in this embodiment, the fixing post 12 may be fixed and installed on the inner surface of the frame side 11 of the front frame 10 by means of soldering or riveting. Or the fixing post 12 may be formed on the inner surface of the frame side 11 of the front frame 10 by means of molding integrally.

In this embodiment, the front frame 10 comprises two longer frame sides 11 and two shorter frame sides 11, namely, four frame sides in total. A plurality of fixing posts 12 may be fixed and installed on the inner surface of any one of longer frame sides 11 of the front frame 10, wherein the plurality of fixing posts 12 may be arranged to be spaced. Preferably, the plurality of fixing posts 12 may be arranged to be equally spaced.

Figure 5:
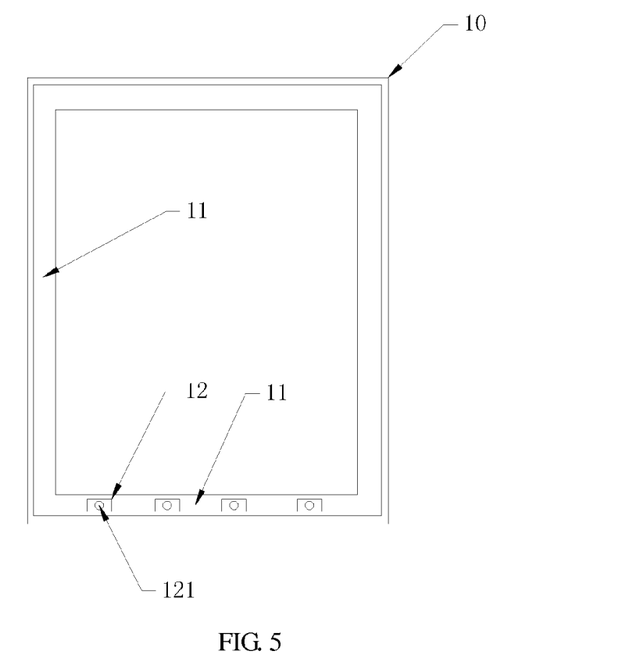
FIG. 5 is a rear plane view of the front frame according to another embodiment of the invention.
Figure 6:
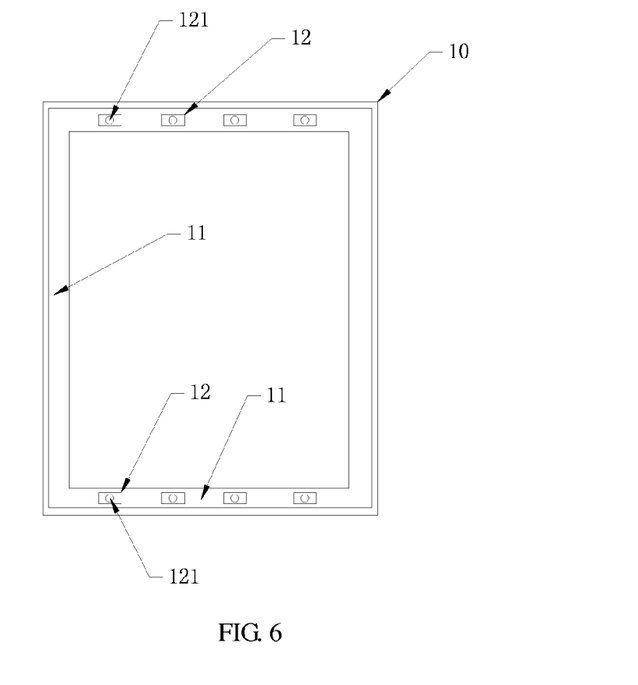
FIG. 6 is a rear plane view of the front frame according to a further embodiment of the invention.
Figure 7:
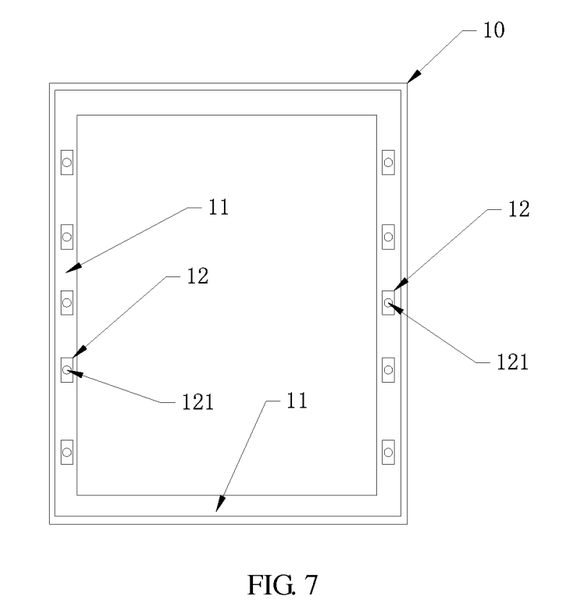
FIG. 7 is a rear plane view of the front frame according to a further embodiment of the invention.
Figure 8:
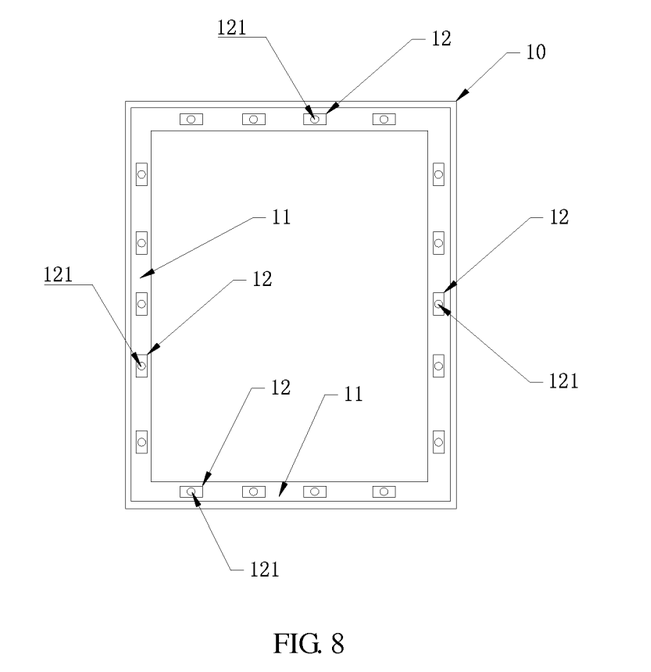
FIG. 8 is a rear plane view of the front frame according to a further embodiment of the invention.
Figure 9:
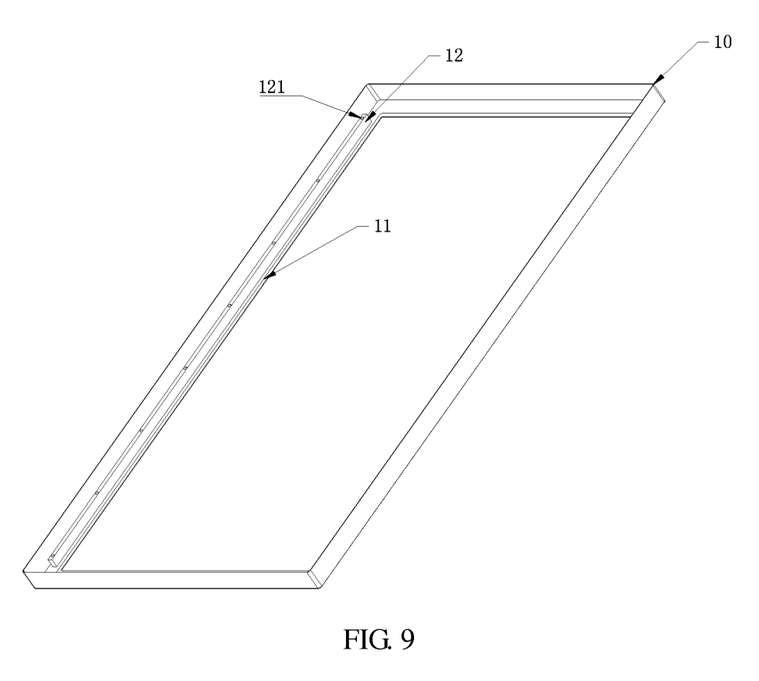
FIG. 9 is a rear perspective view of the front frame according to a further embodiment of the invention.

FIG. 5 is a rear plane view of the front frame according to another embodiment of the invention. FIG. 6 is a rear plane view of the front frame according to a further embodiment of the invention. FIG. 7 is a rear plane view of the front frame according to a further embodiment of the invention. FIG. 8 is a rear plane view of the front frame according to a further embodiment of the invention. FIG. 9 is a rear perspective view of the front frame according to a further embodiment of the invention.

As another embodiment of the invention, referring to FIG. 5, a plurality of fixing posts 12 may be fixed and installed on the inner surface of any one of shorter frame sides 11 of the front frame 10, wherein the plurality of fixing posts 12 may be arranged to be spaced. Preferably, the plurality of fixing posts 12 may be arranged to be equally spaced.

As a further embodiment of the invention, referring to FIG. 9, only one fixing post 12 may be fixed and installed on the inner surface of the same frame side 11 of the front frame 10 (for instance, any one of longer frame side 11 or any one of shorter frame side 11), wherein a plurality of fixing holes 121 may be installed on the one fixing post 12, wherein the plurality of fixing holes 121 may be arranged to be spaced. Preferably, the plurality of fixing holes 121 may be arranged to be equally spaced.

As a further embodiment of the invention, referring to FIG. 8, one or more fixing posts 12 may be installed on all of the inner surfaces of four frame sides 11 of the front frame 10. Like this, the front frame 10 and the back panel 50 may be fixed in the four directions with higher strength.

As a further embodiment of the invention, referring to FIG. 6 and FIG. 7, one or more fixing posts 12 may be installed only on the inner surfaces of the two opposite frame sides 11 of the front frame 10 (for instances, the two opposite shorter frame sides 11 (as shown in FIG. 6) or the two opposite longer frame sides 11 (as shown in FIG. 7), which results in the same technical effects of the invention.

In conclusion, the liquid crystal display device according to embodiments of the invention, by installing the fixing post having the fixing hole on the inner surface of the frame side of the front frame, installing the first through hole at the position of the back panel corresponding with the fixing post, installing the fixing post in the first through hole, and fixing and connecting the fixing unit with the fixing hole, makes the front frame and the back panel fixed each other, and in this way, the outside surface of the front frame doesn't need to install fixing structure so that the outside surface is smooth and meets the requirement for the appearance parts of the liquid crystal display device.

Although the invention has been shown and described with reference to specific embodiments, it would be understood by those skilled in the art that various formal and detailed changes may be made herein without departing from the spirit and scope of the invention defined by the claims and their equivalents.

What is claimed is:

1. A liquid crystal display device comprising:
a front frame forming a frame opening, a back panel, a middle frame and a fixing unit for holding the front frame, a back panel and a middle frame clamped together in order to retain a liquid crystal display panel;
wherein the a front frame has a fixing post with a fixed end attached an inner surface of the front frame, the position of the back panel corresponding with the fixing post forming a first through hole sized to receive the fixing post there through, and the position of the middle frame corresponding with the fixing post forming a second through hole sized to receive the fixing post there through; wherein a free end of the fixing post is provided with a fixing hole, when assembled the fixing post passes through the first and second through holes, and the fixing unit is connectable with the fixing hole so that the front frame, the middle frame and the back panel are clamped together.

2. The liquid crystal display device of claim 1, wherein a plurality of fixing posts are installed on the inner surface of each of a plurality of frame sides of the front frame; and wherein the plurality of fixing posts are arranged to be spaced apart.

3. The liquid crystal display device of claim 1, wherein an edge of a liquid crystal display panel can be retained between the front frame and a middle frame.

4. The liquid crystal display device of claim 1, wherein at least one fixing post is installed on all of the inner surfaces of four frame sides of the front frame.

5. The liquid crystal display device of claim 1, wherein the fixing post is installed only on the inner surfaces of the two opposite frame sides of the front frame.

6. The liquid crystal display device of claim 1, wherein the fixing post is fixed and installed on the inner surface of the frame side of the front frame by means of soldering or riveting.

7. The liquid crystal display device of claim 1, wherein the fixing post is molded integrally with the front frame.

8. The liquid crystal display device of claim 1, wherein the fixing unit is a screw, and a screw thread matched with the fixing unit is installed at an inner wall of the fixing hole.

9. A liquid crystal display device comprising:
a front frame, a back panel and a fixing unit;
wherein a fixing post is installed on an inner surface of the front frame, the position of the back panel corresponding with the fixing post comprises a first through hole sized to receive the fixing post there through; wherein the fixing post comprises a fixing hole, the fixing post is installed in the first through hole, the fixing unit is connectable with the fixing hole so that the front frame and the back panel are fixed each other in order to retain an edge of a liquid crystal display panel there between.

10. The liquid crystal display device of claim 9, wherein the liquid crystal display device further comprises a middle frame installed between the front frame and the back panel; wherein the position of the middle frame corresponding with the fixing post comprises the second through hole, the fixing post passes through the second through hole and is installed in the first through hole, the fixing unit is fixed and connected with the fixing hole so that the front frame, the middle frame and the back panel are fixed each other.

11. The liquid crystal display device of claim 9, wherein a plurality of fixing posts are installed on an inner surface of the same frame side of the front frame; wherein the plurality of fixing posts are arranged to be spaced.

12. The liquid crystal display device of claim 9, wherein only one fixing post is installed on an inner surface of the same frame side of the front frame, and the fixing post comprises a plurality of fixing holes; wherein the plurality of fixing holes are arranged to be spaced.

13. The liquid crystal display device of claim 9, wherein the fixing post is installed on all of the inner surfaces of four frame sides of the front frame.

14. The liquid crystal display device of claim 9, wherein the fixing post is installed only on the inner surfaces of the two opposite frame sides of the front frame.

15. The liquid crystal display device of claim 9, wherein the fixing post is fixed and installed on the inner surface of the frame side of the front frame by means of soldering or riveting.

16. The liquid crystal display device of claim 9, wherein the fixing post is molded integrally with the front frame.

17. The liquid crystal display device of claim 9, wherein the fixing unit is a screw, and a screw thread matched with the fixing unit is installed at an inner wall of the fixing hole.

* * * * *